(12) United States Patent
Qin et al.

(10) Patent No.: US 11,281,018 B2
(45) Date of Patent: Mar. 22, 2022

(54) LIGHT COLLIMATING THIN FILM, EDGE-TYPE BACKLIGHT MODULE, LIQUID CRYSTAL DISPLAY DEVICE AND MICRO LIGHT EMITTING DIODE DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Jianwei Qin, Beijing (CN); Bing Zhang, Beijing (CN); Liang Gao, Beijing (CN); Bo Han, Beijing (CN); Hai Tang, Beijing (CN); Lu Gao, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 184 days.

(21) Appl. No.: 16/552,962

(22) Filed: Aug. 27, 2019

(65) Prior Publication Data
US 2020/0166767 A1    May 28, 2020

(30) Foreign Application Priority Data
Nov. 22, 2018    (CN) .......................... 201811398322.0

(51) Int. Cl.
| G02B 27/30 | (2006.01) |
| F21V 8/00 | (2006.01) |
| H01L 25/075 | (2006.01) |
| H01L 33/58 | (2010.01) |

(52) U.S. Cl.
CPC ............. *G02B 27/30* (2013.01); *G02B 6/005* (2013.01); *G02B 6/009* (2013.01); *G02B 6/0088* (2013.01); *H01L 25/0753* (2013.01); *H01L 33/58* (2013.01)

(58) Field of Classification Search
CPC ...... G02B 27/30; G02B 6/005; G02B 6/0088; G02B 6/009; H01L 25/0753; H01L 33/58
See application file for complete search history.

(56) References Cited

U.S. PATENT DOCUMENTS

| 2005/0259198 A1* | 11/2005 | Lubart .............. G02F 1/133524 349/113 |
| 2009/0015930 A1 | 1/2009 | Hikmet et al. |

FOREIGN PATENT DOCUMENTS

| CN | 1890584 A | 1/2007 |
| CN | 102156362 A | 8/2011 |
| CN | 106019713 A | 10/2016 |

OTHER PUBLICATIONS

"First Office Action and English language translation", CN Application No. 201811398322.0, dated Aug. 18, 2020, 13 pp.

* cited by examiner

*Primary Examiner* — Mary Ellen Bowman
(74) *Attorney, Agent, or Firm* — Myers Bigel, P.A.

(57) ABSTRACT

The present application discloses a light collimating thin film, an edge-type backlight module, a liquid crystal display device, and a micro light emitting diode display device. The light collimating thin film includes a substrate having a first surface and a second surface which are opposed to each other, and a plurality of conical structures respectively penetrating the substrate. Axes of the plurality of conical structures are respectively perpendicular to the first surface and the second surface.

12 Claims, 5 Drawing Sheets

LIGHT COLLIMATING THIN FILM, EDGE-TYPE BACKLIGHT MODULE, LIQUID CRYSTAL DISPLAY DEVICE AND MICRO LIGHT EMITTING DIODE DISPLAY DEVICE

RELATED APPLICATION

The present application claims the benefit of Chinese Patent Application No. 201811398322.0, filed on Nov. 22, 2018, the content of which is incorporated herein by reference in its entirety.

TECHNICAL FIELD

The present disclosure relates to the field of display technology, and in particular, to a light collimating thin film and its application. More specifically, the present disclosure relates to a light collimating thin film, an edge-type backlight module, a liquid crystal display device, and a micro light emitting diode display device.

BACKGROUND

With the development of technology, the security of information is becoming more and more important. Therefore, in order to prevent personal privacy and important information from being peeped by somebody who had bad motives, more and more peep-proofing technologies are applied to displays, such as bank ATM (Automated Teller Machine), self-service ticketing terminal, and the like. However, the peep-proofing effects of conventional displays are relatively poor. For personal terminal mobile display products such as mobile phones and laptops, the applications of the peep-proofing technologies are not developed.

SUMMARY

According to an aspect of the present disclosure, there is provided a light collimating thin film comprising a substrate having a first substrate and a second surface that are opposed to each other, and a plurality of conical structures respectively penetrating the substrate, wherein axes of the plurality of conical structures are respectively perpendicular to the first surface and the second surface.

In some embodiments, a cross section of each of the plurality of conical structures within the first surface is a first cross section, and a cross section of each of the plurality of conical structures within the second surface is a second cross section, wherein the second cross section is configured to receive light to be collimated, and an area of the first cross section is larger than an area of the second cross section.

In some embodiments, each of the plurality of conical structures comprises a hole, and an inner wall of the hole is covered with a first reflective layer.

In some embodiments, each of the plurality of conical structures is filled up with a conical material, and a refractive index of the conical material is greater than a refractive index of a material of the substrate.

In some embodiments, the material of the substrate comprises polyethylene terephthalate.

In some embodiments, a portion of the second surface of the substrate other than the second cross section is provided with a second reflective layer.

In some embodiments, a shape of a cross section of each of the plurality of conical structures in a plane perpendicular to the axes has a shape of circular.

In some embodiments, a bottom angle of each of the plurality of conical structures ranges from 75° to 850°.

In some embodiments, a diameter of the first cross section ranges from 0.15 mm to 0.20 mm, and a diameter of the second cross section ranges from 0.05 mm to 0.10 mm.

In some embodiments, a height of each of the plurality of conical structures along a direction perpendicular to the first surface ranges from 0.2 mm to 0.4 mm.

In some embodiments, a cross section of each of the plurality of conical structures in a plane perpendicular to the axes has a shape of rhombus.

In some embodiments, the plurality of conical structures are arranged in an array, wherein the plurality of conical structures comprise two adjacent conical structures, and a distance between the two adjacent conical structures ranges from 0.10 mm to 0.25 mm.

According to another aspect of the present disclosure, there is provided an edge-type backlight module, comprising the light collimating thin film according to any of the embodiments of the present disclosure, a light guide plate on the second surface of the light collimating thin film, and a light source at a light incident surface of the light guide plate.

According to yet another aspect of the present disclosure, there is provided a liquid crystal display device comprising the edge-type backlight module according to any one of the embodiments of the present disclosure.

According to still another aspect of the present disclosure, there is provided a micro light emitting diode display device comprising a display substrate and the light collimating thin film according to any one of the embodiments of the present disclosure, wherein a side of the display substrate is provided with a plurality of micro light emitting diodes, and wherein the light collimating thin film covers the plurality of micro light emitting diodes, and each of the plurality of micro light emitting diodes is arranged at a geometric center of the second cross section of a corresponding one of the plurality of conical structures.

BRIEF DESCRIPTION OF THE DRAWINGS

The above aspects of the disclosure will be explained in conjunction with the following drawings and descriptions of embodiments. In the drawings.

DETAILED DESCRIPTION OF EMBODIMENTS

Embodiments of the present disclosure will be described in detail below. Those skilled in the art will appreciate that the following embodiments are intended to be illustrations of the present disclosure and are not to be considered as limitations. Unless specifically stated otherwise, when specific techniques or conditions are not explicitly described in the following embodiments, those skilled in the art can implement the embodiment according to commonly used techniques or conditions in the art or according to product manuals.

So far, the conventional display cannot control light, and its display angle is large, making it difficult to achieve the peep-proof effect.

Figure 1:
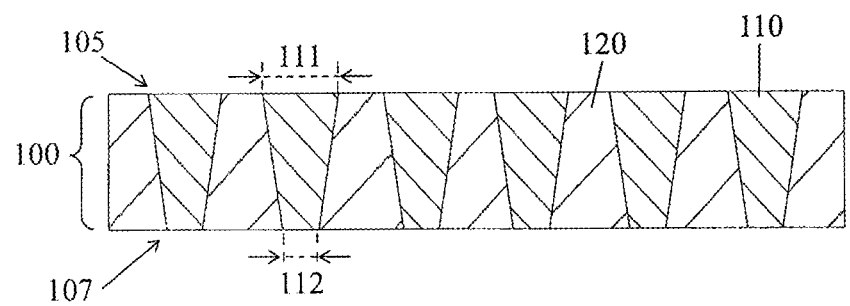
FIG. 1 schematically illustrates a cross section of a light collimating thin film according to an embodiment of the present disclosure.

According to one aspect of the present disclosure, there is provided a light collimating thin film. FIG. 1 schematically illustrates a cross section of a light collimating thin film according to an embodiment of the present disclosure. As shown in FIG. 1, the light collimating thin film 100 comprises a plurality of conical structures 110 and a substrate 120. The substrate 120 has a first surface 105 and a second surface 107 which are opposed to each other. The conical structures 110 are embedded in the substrate 120. Each conical structure 110 penetrates the substrate 120. The axis of each conical structure 110 is perpendicular to the first surface 105 and the second surface 107, i.e., the axis also passes through the first surface 105 and the second surface 107, particularly perpendicular to the first surface 105 and the second surface 107.

Each conical structure comprises a first cross section 111 and a second cross section 112. The first cross section 111 refers to a cross section of the conical structure obtained by cutting off the conical structure 110 by the first surface 105. The second cross section 112 refers to a cross section of the conical structure obtained by cutting off the conical structure 110 by the second surface 107. The second cross section 112 receives the light to be collimated by the conical structure and couple the received light into the conical structure. An area of the first cross section 111 is larger than an area of the second cross section 112. That is, the light to be collimated enters into the conical structure from a smaller cross section of the conical structure, and then is collimated by the conical structure and exits from a larger cross section.

Figure 2:
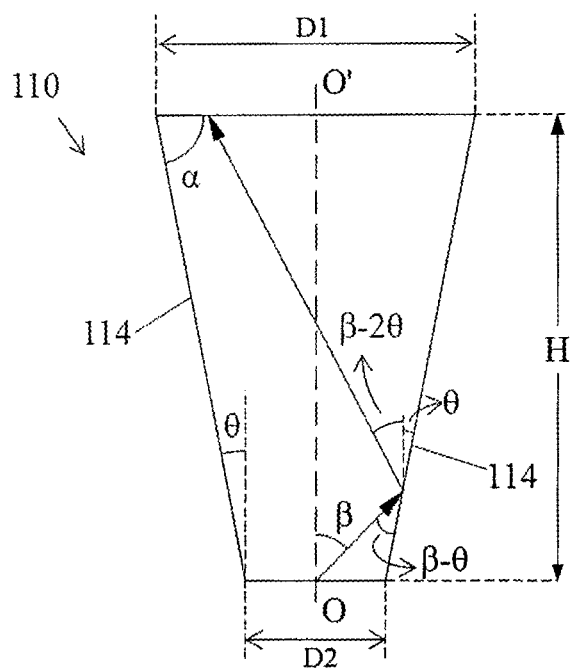
FIG. 2 schematically illustrates an internal light path of a conical structure according to an embodiment of the present disclosure.

FIG. 2 illustrates the principle of collimating light by the conical structure 110. As shown in FIG. 2, the incident light initially travels in the conical structure 110 in a direction that is at an angle $\beta$ to the axis OO' of the conical structure. Then, the light is reflected at the inner wall of the conical structure. The inner wall of the conical structure refers to the inner side (i.e., the side facing the axis) of the side face 114 of the conical structure. When the taper of the conical structure 110 is $\theta$, the angle between the light and the axis OO' is reduced by $2\theta$ (i.e., $\beta-2\theta$) every time the light is reflected, until the angle between the light and the axis is reduced to be less than or equal to the angle $\theta$. As such, the incident light exits the conical structure after one or more times of reflection in the conical structure 110 such that the range of the exit angle is effectively reduced. Therefore, by using the conical structure 110, the light collimating thin film 100 can have a light collimating effect, so that the backlight module has a peep-proofing function. The light collimating thin film provided by the present disclosure has a plurality of conical structures. By utilizing the collimating effect of the conical structure, the range of the exit angle of the light passing through the light collimating thin film can be limited.

Figure 3:
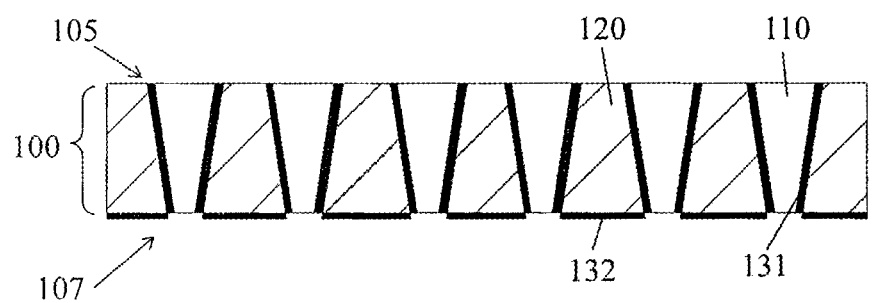
FIG. 3 schematically illustrates a cross section of a light collimating thin film according to another embodiment of the present disclosure.

In order to converging the range of the light exiting angle by the conical structure 110, the material and composition of the conical structure 110 should be decided according to the range of incident angles of light incident into the light collimating thin film 100. FIG. 3 schematically illustrates a cross section of a light collimating thin film according to an embodiment of the present disclosure. As shown in FIG. 3, the conical structure 110 may comprises a hole, and the inner wall of the hole is covered with a first reflective layer 131. The term "hole" means that the conical structure 110 penetrates the substrate 120 from top to bottom (i.e., from the first surface 105 to the second surface 107 of the substrate). The conical structure in the shape of hole can be understood as the hollowing of the substrate 120. The first reflective layer 131 is actually arranged on the surface of the substrate 120 formed by the hollowing. The light collimating thin film 100 can be obtained by forming a plurality of holes 110 penetrating a substrate material. The inner wall surface of the conical structure 110 is coated with the first reflecting layer 131 to further ensure reflection of light to improve the light collimating effect.

Figure 4:
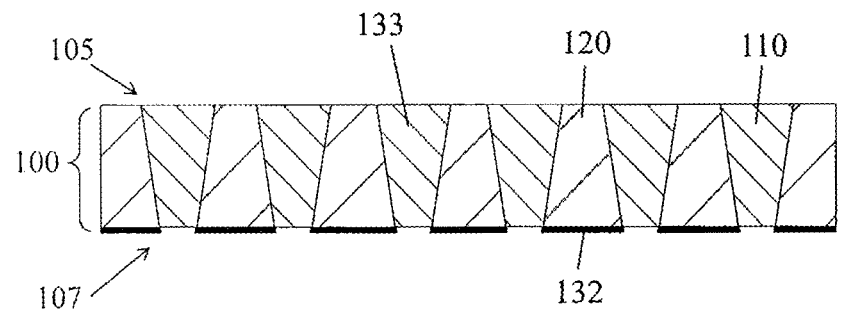
FIG. 4 schematically illustrates a cross section of a light collimating thin film according to yet another embodiment of the present disclosure.

FIG. 4 schematically illustrates a cross section of a light collimating thin film according to another embodiment of the present disclosure. As shown in FIG. 4, the hole is filled with a filling material 133 whose refractive index (n1) is larger than the refractive index (n2) of the material forming the substrate 120. Thus, by appropriately selecting n1 and n2, the light will experience total (internal) reflection on the interface between the filling material and the substrate, thereby achieving the light collimating effect of the light collimating thin film 100.

Figure 5:
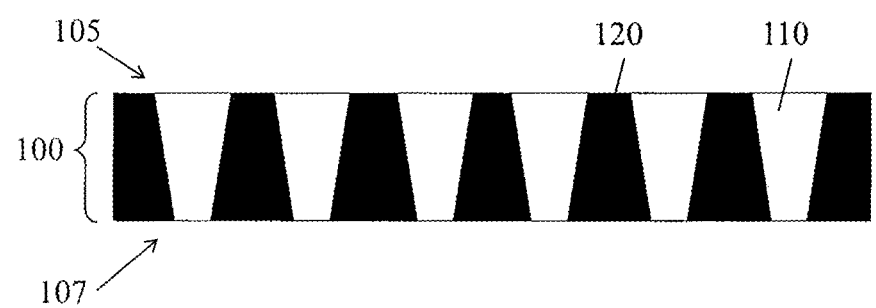
FIG. 5 schematically illustrates a cross section of a light collimating thin film according to still another embodiment of the present disclosure.
Figure 6:
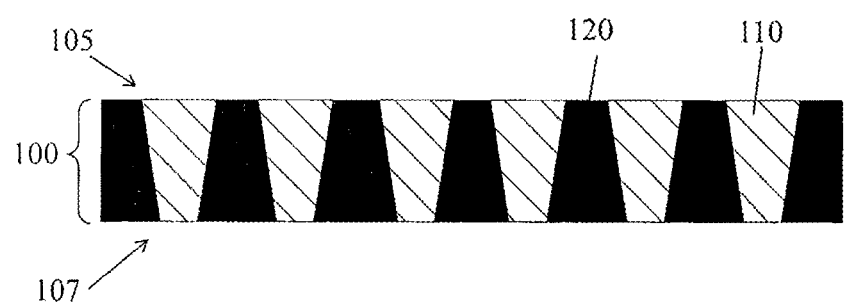
FIG. 6 schematically illustrates a cross section of a light collimating thin film according to still another embodiment of the present disclosure.

FIG. 5 and FIG. 6 schematically illustrate cross sections of light collimating thin films according to other embodiments of the present disclosure. In some embodiments of the present disclosure, the material forming the substrate 120 may be an opaque material or a reflective material, such as a metal or the like. As such, the light impinging the region of the second surface 107 of the light collimating thin film 100 which is not the second cross sections may be reflected or absorbed, thereby ensuring that the light only passes through the conical structure 110 to enhance the collimating effect. In other embodiments of the present disclosure, the material forming the substrate 120 may be a light transmissive material (as shown in FIG. 3 and FIG. 4), such as, for example, polyethylene terephthalate (PET) or the like, in which case a second reflective layer 132 is arranged at regions of the second surface 107 other than the second cross sections. As such, light incident at the regions of the second surface 107 of the light collimating thin film 100 other than the second cross sections is reflected rather than absorbed by the substrate 120, so that the light will attempt to enter into the conical structure 110 again. This provides a higher probability of light to be entering into the conical structure 110, thereby further improving the light utilization efficiency while ensuring the collimating effect of the light collimating thin film 100.

Figure 7A:
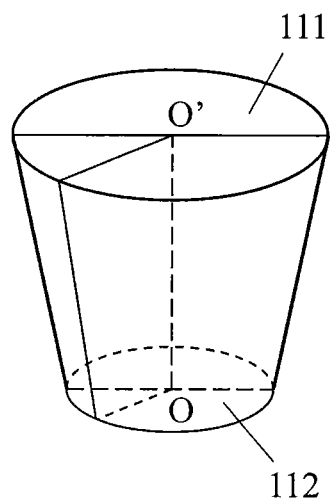
FIG. 7A schematically illustrates a perspective view of a conical structure of a light collimating thin film according to an embodiment of the present disclosure.
Figure 7B:
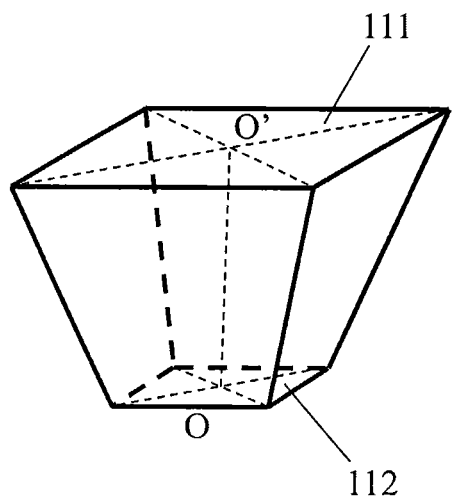
FIG. 7B schematically illustrates a perspective view of a conical structure of a light collimating thin film according to another embodiment of the present disclosure.

In some embodiments of the present disclosure, the shape of the cross section of the conical structure 110 may comprise a circular or a rhombus. FIG. 7A schematically illustrates an embodiment in which the shape of the cross section of the conical structure is a circular. FIG. 7B schematically illustrates an embodiment in which the shape of the cross section of the conical structure is a rhombus. It can be seen that the conical structure is a frustum of a cone, wherein the cone could be a circular cone or a pyramid cone. These shapes of the cross section can result in a relatively large side surface area, allowing multiple total reflections of the incident light and resulting in a smaller range of the light exiting angle. In the specific examples in which the shape of the cross section of the conical structure 110 is a circular shape, the conical structure 110 can have the largest side surface area, which can realize the collimating effect of the conical optical fiber.

In some embodiments of the present disclosure, as shown in FIG. 2, a bottom angle α of the conical structure 110 may be 75°-85° (i.e., the taper θ is 50-15°), a diameter D1 of the first cross section may be 0.15 mm-0.20 mm, and a diameter D2 of the second cross section may be 0.05 mm-0.10 mm. A height H of the conical structure 110 along a direction perpendicular to the first surface (i.e., a distance between the first cross section and the second cross section) may be 0.2-0.4 mm. For a conical structure having a non-circular cross section, the term "diameter" may indicate the length of the diagonal of the cross section or the distance between two vertexes that are not adjacent. By using the conical structure 110 having the above size range, the light collimating thin film 100 can have a better collimating effect. In some specific examples, the bottom angle α of the conical structure 110 can be about 80° (the taper θ is about 10°), the dimension D1 of the top surface (the first cross section) is about 0.18 mm, the dimension D2 of the bottom surface (the second cross section) is about 0.074 mm, and the height is about 0.3 mm. As such, by using the conical structure 110 having the above size, the light collimating thin film 100 can form an light exiting angle within the range of ±40°, thereby fully satisfying the peep-proofing requirement.

Figure 8:
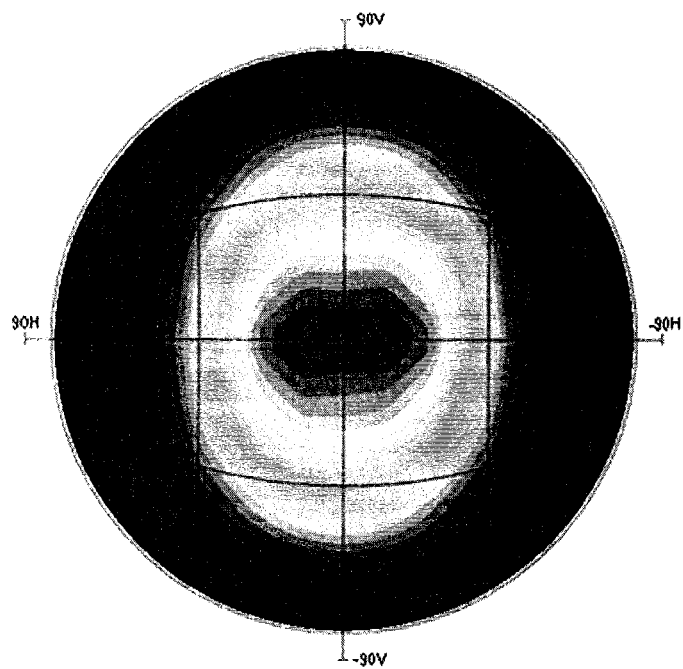
FIG. 8 schematically illustrates an angular illuminance simulation diagram of a light collimating thin film according to an embodiment of the present disclosure under a surface light source, the light collimating thin film comprising conical structures the cross sections of which are circulars.
Figure 9:
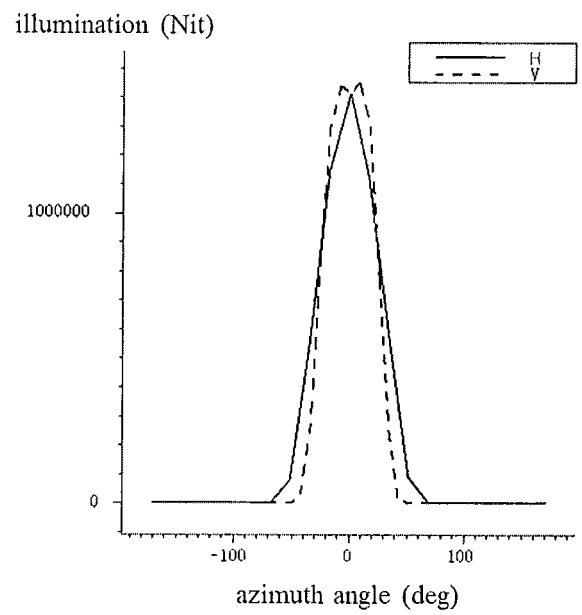
FIG. 9 schematically illustrates a simulation graph showing the relationship between brightness (illumination) and position (azimuth angle) in the H (horizontal) direction and the V (vertical) direction in FIG. 8.

In some embodiments of the present disclosure, the plurality of conical structures is arranged in an array. The plurality of conical structures comprises two adjacent conical structures, and the spacing between the two adjacent conical structures 110 is 0.10 mm-0.25 mm. The spacing between the two adjacent conical structures represents the distance between the two closest points respectively of the two first cross sections or the two second cross sections of two adjacent conical structures in a row or a column of the array. As such, the light collimating effect imposed to a large-size backlight module can be more uniform. In some specific examples, the shape of the cross section of the conical structure 110 is circular, and the spacing of two adjacent conical structures arranged in a row or a column of the array is about 0.2 mm, and the bottom angle α of each conical structure 110 may be about 80°. The diameter D1 of the first cross section is about 0.18 mm, the diameter D2 of the second cross section is about 0.074 mm, and the height is about 0.3 mm. FIG. 8 illustrates an angular illuminance simulation diagram of the light collimating thin film 100, which is obtained by a simulation of a surface light source being imposed on the second surface 107 of the light collimating thin film 100 having the above-described size. FIG. 9 shows a brightness graph as a function of angle in the horizontal (H) direction and vertical (V) direction, respectively. As can be seen from FIG. 8 and FIG. 9, a half-brightness angle of the light collimating thin film 100 is 20° and a cut-off angle is 40°. As such, the above-mentioned light collimating thin film 100 can well satisfy the peep-proofing angle requirement of the display device.

In summary, according to embodiments of the present disclosure, there is provided a light collimating thin film comprising a substrate and a plurality of conical structures. The substrate has a first surface and a second surface opposed to each other. Each of the plurality of conical structures penetrates the substrate. The axis of each of the conical structures is perpendicular to the first surface and the second surface. The cross section of each conical structure within the first surface is a first cross section, the cross section of each conical structure within the second surface is a second cross section, wherein the second cross section is configured to receive light to be collimated, and the area of the first cross section is larger than the area of the second cross section.

The light collimating thin film according to the embodiments of the present disclosure utilizes the collimating effect of the conical structure to limit the range of exit angle of light passing through the light collimating thin film. As such, the light passing through the light collimating thin film can be collimated, so that the backlight module can have a peep-proofing function. The light collimating thin film can be applied to different types of display products such as LCD, OLED, and Micro LED display device or the like, to achieve the required peep-proofing requirements. The light collimating thin film can also be combined with augmented reality (AR)/virtual reality (VR) devices, to increase the energy received by human eyes and reduce energy consumption.

In another aspect of the present disclosure, there is provided an edge-type backlight module.

Figure 10:
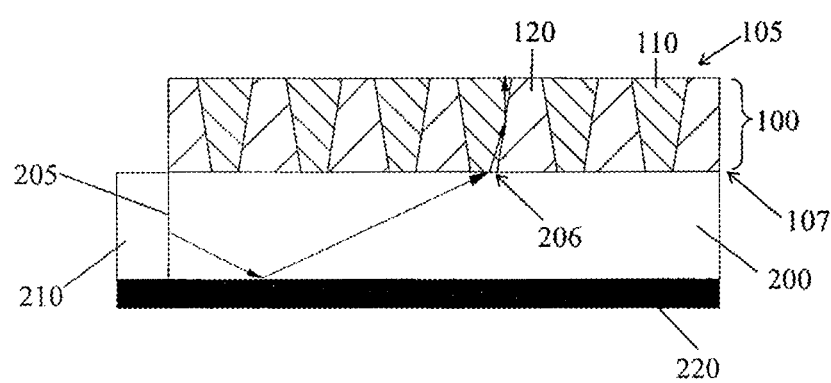
FIG. 10 schematically illustrates a cross section of an edge-type light guide plate according to an embodiment of the present disclosure.

FIG. 10 schematically illustrates a cross section of an edge-type backlight module according to an embodiment of the present disclosure. As shown in FIG. 10, the edge-type backlight module 20 comprises a light guide plate 200 and the light collimating thin film 100 according to an embodiment of the present disclosure. The light guide plate 200 comprises a light incident surface 205. A light source 210 is arranged at the light incident surface. The light guide plate 200 further comprises a light exit surface 206. The light collimating thin film 100 is arranged on the light exit surface 206 of the light guide plate 210. The edge-type backlight module further comprises a reflective sheet 220 arranged on a side of the light guide plate opposite to the light exit surface 206. As such, the light emitted by the light source 210 (for example, a LED Bar) is incident into the light guide plate through the light incident surface 205 of the edge-type light guide plate 200, and is incident into the conical structures 110 of the light collimating thin film 100 after being reflected by the reflection sheet 220. After multiple reflections, the light emitted by the light source 210 exits the light collimating thin film 100. The exiting light is highly collimated.

The edge-type backlight module provided by the present disclosure can realize the peep-proofing function through the light collimating thin film. The features and advantages described above for the light collimating thin film are still applicable to the edge-type backlight module, and will not be described herein.

Figure 11:
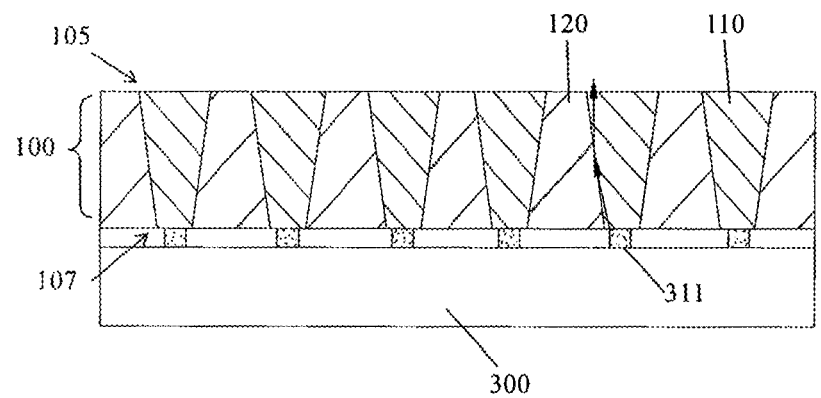
FIG. 11 schematically illustrates a cross section of a micro light emitting diode display device according to an embodiment of the present disclosure.

The present disclosure also provides a micro light emitting diode display device. FIG. 11 illustrates a cross section of a micro light emitting diode display device according to an embodiment of the present disclosure. As shown in FIG. 10, the micro light emitting diode display device 30 comprises a display substrate 300 and the light collimating thin film 100. A plurality of micro light emitting diodes (Micro LEDs) 311 is arranged on one side of the display substrate 300. The light collimating thin film 100 covers the plurality of Micro LEDs 311. Each Micro LED 311 is arranged at a position corresponding to the center of the second cross section 112 of the corresponding conical structure 110. As such, the exiting light emitted by each Micro LED 311 and reflected inside the conical structure 110 of the light collimating thin film 100 is highly collimated light, the light loss is less and the light utilization efficiency is higher.

It should be noted that, in addition to the display substrate, the micro LED display device comprises other necessary components and structures, such as a housing, a control circuit board or a power line, and the like, which will not be described herein.

In another aspect of the present disclosure, there is provided a liquid crystal display device. According to an embodiment of the present disclosure, the liquid crystal display device comprises the above-described edge-type backlight module.

According to embodiments of the present disclosure, the specific type of the liquid crystal display device is not particularly limited, such as a display screen, a television, a mobile phone, a tablet computer, or a smart watch, and the like. Those skilled in the art can select accordingly according to actual use requirements of the display device, which will not be described herein. It should be noted that, in addition to the backlight module, the display device comprises other necessary components and structures, such as a display panel, housing, a control circuit board or a power line, and the like, if the display screen is chosen as an example of the display device. Those skilled in the art can imagine the components and structures according to the function of the display device, which will not be described herein.

In summary, according to embodiments of the present disclosure, the present disclosure provides a liquid crystal display device comprising an edge-type backlight module having a peep-proofing function, thereby enabling the liquid crystal display device to have a peep-proofing effect of a small angle display. It can be understood by those skilled in the art that the features and advantages described above for the light collimating thin film and the edge-type backlight module are still applicable to the liquid crystal display device, which will not be described herein.

In the description of the present disclosure, it is to be understood that the terms indicating the orientation or positional relationships such as "center", "longitudinal", "transverse", "length", "width", "thickness", "upper", "lower", "front", "rear", "left", "right", "vertical", "horizontal", "top", "bottom", "inner", "outer", "clockwise", "counter-clockwise", "axial", "radial", and "circumferential" are based on the orientation or positional relationships shown in the drawings, are merely for the convenience of describing the present disclosure and simplifying the description, and do not indicate or imply that the devices or the elements must have particular orientations, or be constructed and operated in particular orientations. Thus they are not to be construed as limiting the disclosure.

Moreover, the terms "first" and "second" etc., are used for descriptive purposes only and are not to be construed as indicating or implying a relative importance or the amount of the technical features. Thus, features defining with "first" or "second" or similar terms may comprise at least one of the features, either explicitly or implicitly. In the description of the present disclosure, the meaning of "a plurality of" is at least two, such as two, three, etc., unless specifically defined otherwise.

In the description of the present specification, the descriptions of the terms "one embodiment", "some embodiments", "example", "specific examples", or "some examples" and the like are intended to mean the specific features, structures, materials or characteristics described in connection with the embodiments or examples are comprised in at least one embodiment or example of the present disclosure. In the present specification, the schematic representation of the above terms is not necessarily directed to the same embodiment or example. Furthermore, the specific features, structures, materials, or characteristics described may be combined in a suitable manner in any one or more embodiments or examples. In addition, various embodiments or examples described in the specification, as well as features of various embodiments or examples, may be combined and connected by those skilled in the art without conflicting.

While the embodiments of the present disclosure have been shown and described above, it may be understood that the foregoing embodiments are illustrative and are not to be construed as limiting the scope of the disclosure. Changes, modifications, substitutions and variations of the above-described embodiments may be made by those of ordinary skill in the art within the scope of the present disclosure.

What is claimed is:

1. A light collimating thin film, comprising:
a substrate having a first surface and a second surface that are opposed to each other, wherein a material of the substrate is a light transmissive material; and
a plurality of conical structures respectively penetrating the substrate,
wherein axes of the plurality of conical structures are respectively perpendicular to the first surface and the second surface,
wherein conical material is in each of the plurality of conical structures, and a refractive index of the conical material is greater than a refractive index of the material of the substrate,
wherein each of the plurality of conical structures comprises a hole,
wherein an entire surface of an inner wall of the hole is overlapped with a first reflective layer, and a material of the first reflective layer is a reflective material
wherein a cross section of each of the plurality of conical structures within the first surface is a first cross section, and a cross section of each of the plurality of conical structures within the second surface is a second cross section, the second cross section is configured to receive light to be collimated that is emitted by a micro light emitting diode to be arranged at a geometric center of the second cross section, and
wherein an area of the first cross section is greater than an area of the second cross section.

2. The light collimating thin film of claim 1, wherein the substrate comprises polyethylene terephthalate.

3. The light collimating thin film of claim 1, wherein a portion of the second surface of the substrate that excludes the second cross section of each of the plurality of conical structures is provided with a second reflective layer.

4. The light collimating thin film of claim 1, wherein a cross section of each of the plurality of conical structures in a plane perpendicular to the axes has a circular shape.

5. The light collimating thin film of claim 4, wherein a bottom angle of each of the plurality of conical structures ranges from 75° to 85°.

6. The light collimating thin film of claim 4,
   wherein a diameter of the first cross section ranges from 0.15 mm to 0.20 mm, and
   wherein a diameter of the second cross section ranges from 0.05 mm to 0.10 mm.

7. The light collimating thin film of claim 4, wherein a height of each of the plurality of conical structures along a direction perpendicular to the first surface ranges from 0.2 mm to 0.4 mm.

8. The light collimating thin film of claim 1, wherein a cross section of each of the plurality of conical structures in a plane perpendicular to the axes has a rhombus shape.

9. The light collimating thin film of claim 1,
   wherein the plurality of conical structures are arranged in an array,
   wherein the plurality of conical structures comprise two adjacent conical structures, and
   wherein a distance between the two adjacent conical structures ranges from 0.10 mm to 0.25 mm.

10. An edge-type backlight module, comprising:
    the light collimating thin film of claim 1, and
    a plurality of micro light emitting diodes each of which is arranged at the geometric center of the second cross section of a corresponding one of the plurality of conical structures.

11. A liquid crystal display device, comprising the edge-type backlight module of claim 10.

12. A micro light emitting diode display device, comprising:
    a display substrate, wherein a side of the display substrate is provided with a plurality of micro light emitting diodes, and
    the light collimating thin film of claim 1, wherein the light collimating thin film overlaps the plurality of micro light emitting diodes, and each of the plurality of micro light emitting diodes is arranged at the geometric center of the second cross section of a corresponding one of the plurality of conical structures.

\* \* \* \* \*